United States Patent
Subramani et al.

(10) Patent No.: US 10,597,785 B2
(45) Date of Patent: Mar. 24, 2020

(54) SINGLE OXIDE METAL DEPOSITION CHAMBER

(71) Applicant: Applied Materials, Inc., Santa Clara, CA (US)

(72) Inventors: Anantha K. Subramani, San Jose, CA (US); Praburam Gopalraja, San Jose, CA (US); Tza-Jing Gung, San Jose, CA (US); Hari K. Ponnekanti, San Jose, CA (US); Philip Allan Kraus, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 226 days.

(21) Appl. No.: 15/703,626

(22) Filed: Sep. 13, 2017

(65) Prior Publication Data

US 2018/0073150 A1    Mar. 15, 2018

Related U.S. Application Data

(60) Provisional application No. 62/393,980, filed on Sep. 13, 2016.

(51) Int. Cl.
  *C23C 14/34* (2006.01)
  *C23C 28/02* (2006.01)
  (Continued)

(52) U.S. Cl.
  CPC ............ *C23C 28/02* (2013.01); *C23C 14/024* (2013.01); *C23C 14/14* (2013.01);
  (Continued)

(58) Field of Classification Search
  CPC .................................................. C23C 14/568
  See application file for complete search history.

(56) References Cited

U.S. PATENT DOCUMENTS

| 6,186,090 | B1 | 2/2001 | Dotter, II et al. |
| 6,596,133 | B1 * | 7/2003 | Moslehi ............ C23C 14/0031 118/723 MP |

(Continued)

FOREIGN PATENT DOCUMENTS

| JP | 2004190082 A | 7/2004 |
| JP | 2005036276 A | 2/2005 |

OTHER PUBLICATIONS

PCT International Search Report and Written Opinion dated Oct. 25, 2017, for International Application No. PCT/US2017/047396.

(Continued)

*Primary Examiner* — Jason Berman
(74) *Attorney, Agent, or Firm* — Patterson + Sheridan LLP

(57) ABSTRACT

Implementations described herein generally relate to metal oxide deposition in a processing chamber. More specifically, implementations disclosed herein relate to a combined chemical vapor deposition and physical vapor deposition chamber. Utilizing a single oxide metal deposition chamber capable of performing both CVD and PVD advantageously reduces the cost of uniform semiconductor processing. Additionally, the single oxide metal deposition system reduces the time necessary to deposit semiconductor substrates and reduces the foot print required to process semiconductor substrates. In one implementation, the processing chamber includes a gas distribution plate disposed in a chamber body, one or more metal targets disposed in the chamber body, and a substrate support disposed below the gas distribution plate and the one or more targets.

20 Claims, 3 Drawing Sheets

(51) Int. Cl.
  *C23C 14/35* (2006.01)
  *C23C 16/44* (2006.01)
  *C23C 14/56* (2006.01)
  *C23C 14/02* (2006.01)
  *C23C 14/14* (2006.01)
  *C23C 14/50* (2006.01)
  *C23C 16/06* (2006.01)
  *C23C 16/40* (2006.01)
  *C23C 16/458* (2006.01)
  *H01J 37/32* (2006.01)
  *H01J 37/34* (2006.01)
  *H01L 21/02* (2006.01)
  *H01L 21/285* (2006.01)

(52) U.S. Cl.
  CPC ........ *C23C 14/3464* (2013.01); *C23C 14/352* (2013.01); *C23C 14/505* (2013.01); *C23C 14/568* (2013.01); *C23C 16/06* (2013.01); *C23C 16/40* (2013.01); *C23C 16/44* (2013.01); *C23C 16/4584* (2013.01); *H01J 37/32458* (2013.01); *H01J 37/32733* (2013.01); *H01J 37/3417* (2013.01); *H01J 37/3488* (2013.01); *H01L 21/02274* (2013.01); *H01L 21/2855* (2013.01)

(56) References Cited

U.S. PATENT DOCUMENTS

2002/0003086 A1* 1/2002 Sferlazzo .............. C23C 14/044
  204/298.11
2007/0017445 A1 1/2007 Takehara et al.

OTHER PUBLICATIONS

Taiwan Office Action dated Feb. 26, 2019 for Application No. 106128534.

* cited by examiner

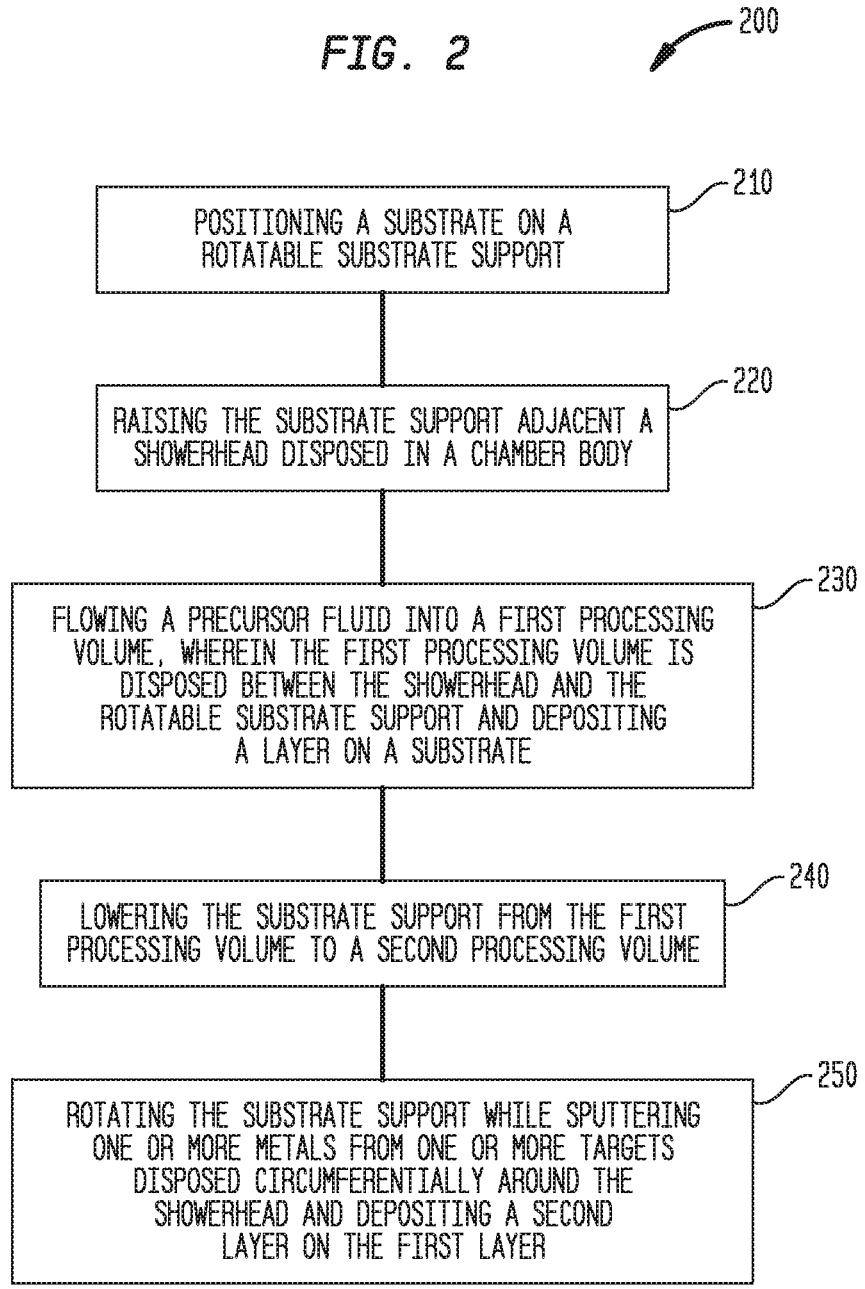

SINGLE OXIDE METAL DEPOSITION CHAMBER

CROSS-REFERENCE TO RELATED APPLICATIONS

This application claims benefit of U.S. provisional patent application Ser. No. 62/393,980, filed Sep. 13, 2016, which is herein incorporated by reference.

BACKGROUND

Field of the Disclosure

Implementations described herein generally relate to metal oxide deposition in a processing chamber. More specifically, implementations disclosed herein relate to a chamber that performs both chemical vapor deposition and physical vapor deposition.

Description of the Related Art

In the fabrication of integrated circuits, deposition processes such as chemical vapor deposition (CVD) or physical vapor deposition (PVD) are used to deposit films of various materials upon semiconductor substrates. These depositions often occur in separate enclosed process chambers.

Process gases are used to deposit films on the substrate in a CVD chamber. The process gases may be supplied to a substrate positioned on a substrate support. A purge gas may be provided to remove process gases. The process gas and the purge gas may be removed from the process chamber using a common exhaust disposed away from the process area, such as around an outer perimeter of the process chamber, to prevent mixing of the purge gas with the process gas in the process area.

A PVD process includes sputtering a target comprising a source material with ions generated in a plasma region, causing ejected source material to travel to the target. The ejected source material may be accelerated towards the substrate via a negative voltage or bias formed on the substrate. Some PVD process chambers provide RF energy to a target to increase uniformity.

The two process chambers employ very different process conditions for deposition. CVD processes operate at much higher temperatures than PVD processes and require the use of specialized precursors. In order to deposit multiple layers of oxide and metal onto a substrate, the substrate is transferred from one chamber to the next and then back again. Using the arrangement described above, contaminants and other impurities may deposit on the substrate during transition from one system to the next, especially when trying to deposit alternating layers of oxide and metal, causing non-uniformity in the semiconductor film.

Thus, there is a need for an improved system and method for depositing an oxide and a metal on a substrate.

SUMMARY

Implementations described herein generally relate to metal oxide deposition in a processing chamber. More specifically, implementations disclosed herein relate to a combined chemical vapor deposition and physical vapor deposition chamber.

In one implementation, a deposition chamber is disclosed. The deposition chamber includes a gas distribution plate disposed in a chamber body, one or more metal targets disposed in the chamber body, and a substrate support selectively disposed in view of the gas distribution plate or in view of one or more targets.

In another implementation, a the deposition chamber includes a gas distribution plate disposed in a central portion of a chamber body, a plurality of targets disposed in peripheral portions of the chamber body, a moveable substrate support disposed below the gas distribution plate, and one or more collimators disposable between the substrate support and the one or more targets.

In another implementation, a method of deposition is disclosed. The method of deposition includes positioning a substrate on a rotatable substrate support, raising the substrate support adjacent a gas distribution plate disposed in a chamber body, and flowing a deposition precursor into a first processing volume. The first processing volume is disposed between the gas distribution plate and the rotatable substrate support. The method also includes depositing a first layer on the substrate, lowering the substrate support from the first processing volume in to a second processing volume in view of one or more targets, rotating the substrate support while sputtering one or more metals from one or more targets disposed circumferentially around the gas distribution plate, and depositing a second layer on the first layer.

BRIEF DESCRIPTION OF THE DRAWINGS

So that the manner in which the above recited features of the disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

FIG. 2 is a flow diagram of a method for deposition in a process chamber, according to one implementation of the disclosure.

Figure 1A:
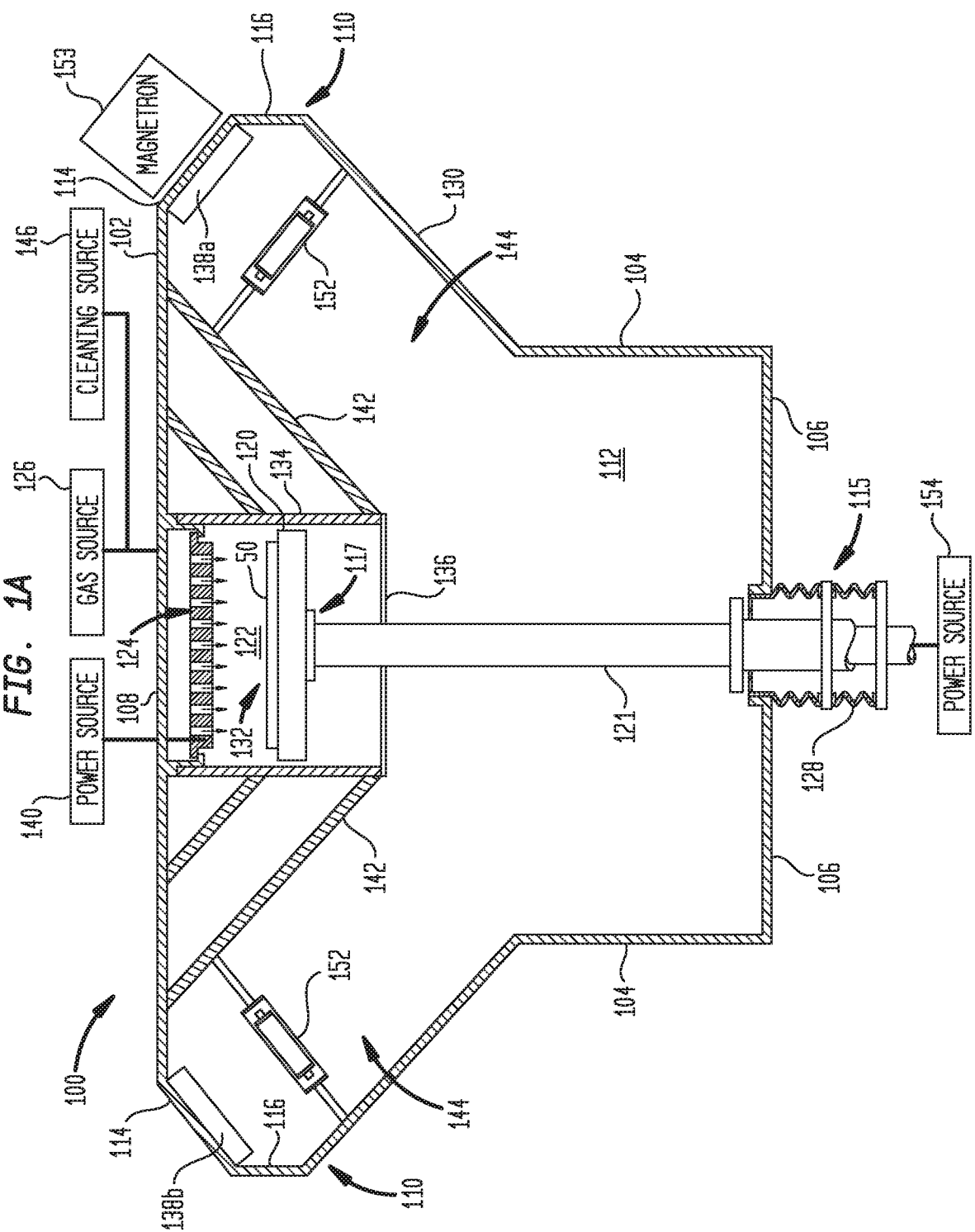
FIG. 1A is a sectional view of a process chamber having a substrate in a raised position during chemical processing, according to one implementation of the disclosure.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

Implementations described herein generally relate to metal oxide deposition in a processing chamber. More specifically, implementations disclosed herein relate to a combined chemical vapor deposition and physical vapor deposition chamber.

Figure 1B:
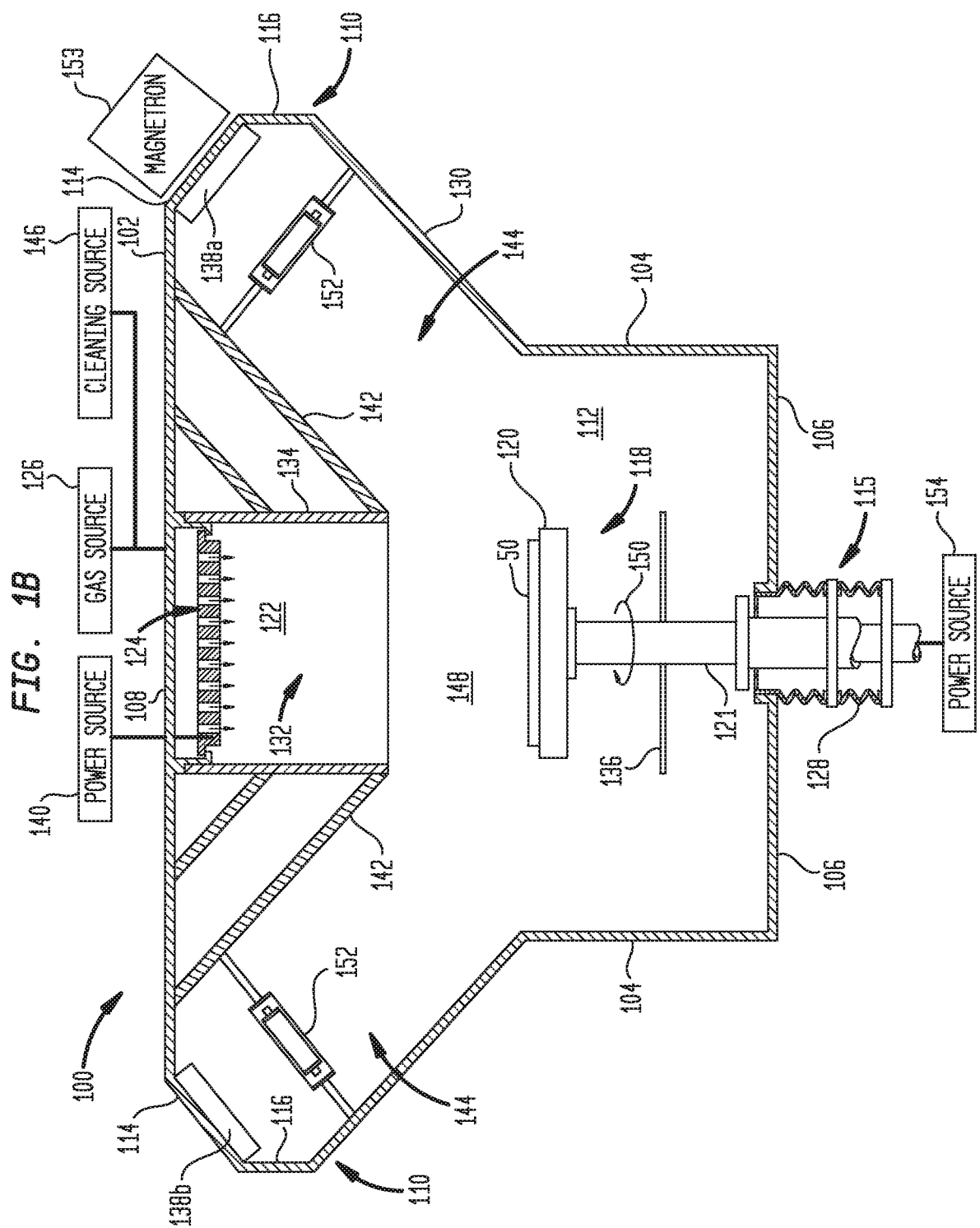
FIG. 1B is a sectional view of the process chamber having a substrate in a lowered position during plasma processing, according to one implementation of the disclosure.

FIG. 1A is a sectional view of a process chamber 100 having a substrate support 120 in a raised position 117 during chemical processing, according to one implementation of the disclosure. FIG. 1B is a sectional view of the process chamber 100 having the substrate support 120 in a lowered position 118 during physical deposition processing, according to one implementation of the disclosure. The sectional views of FIGS. 1A and 1B show major components as described in more detail below.

The process chamber 100 includes a substrate support 120 for supporting a substrate 50, a chamber body 102 having one or more side walls 104, a bottom 106, a lid 108, and one or more peripheral chambers extensions 110. The side walls 104, the bottom 106, the one or more peripheral chamber extensions 110, and the lid 108 define an interior volume 112 of the process chamber 100. In one implementation, the one or more peripheral chamber extensions 110 include a first angled surface 114 adjacent the lid 108, a second angled surface 116 adjacent the first angled surface 114, and a third angled surface 130 adjacent both the second angled surface 116 and the one or more side walls 104. The first angled surface 114 may include an opening for a sputtering source, such as a target 138 to be inserted. In other words, the target 138 may attach to the chamber body 102 in the first angled surface 114 of the one or more peripheral extensions 110.

The process chamber 100 includes a gas distribution plate 124 above the substrate support 120. In one implementation, the gas distribution plate 124 may be disposed in a first portion 132 of the chamber 100. In one implementation, the gas distribution plate 124 is disposed in a central portion of the chamber 100. The first portion 132 may be defined by a column 134 extending from the lid 108. In one implementation the column 134 may extend from the gas distribution plate 124. The first portion 132 may be centrally located in the chamber body 102. In one implementation, the column 134 may be circular. However, the column 134 may be any other geometric shape such as square, hexagonal, oval, etc. The region between the substrate support 120 in the raised position 117 (FIG. 1A) and the gas distribution plate 124 is defined by the process volume 122. The gas distribution plate 124 supplies process gases from a process gas source 126 to the process volume 122. The process chamber 100 may be a plasma chamber, such as a chamber including a plasma source (e.g., a capacitively coupled plasma chamber with a RF-hot gas distribution plate) or a chamber connected to a remote plasma source (RPS).

The substrate support 120 may be formed of a ceramic material, such as aluminum nitride. The substrate support 120 may include an electrostatic chuck, a ceramic body, a heater, a vacuum chuck, a susceptor, or a combination thereof. The substrate support 120 has a substrate supporting surface that receives and supports the substrate 50 during processing. The substrate support 120 is coupled to a supporting shaft 121 that is coupled to a lift mechanism 115 below the bottom 106 of the process chamber 100. A bellows 128 may disposed around the portion of the supporting shaft 121 that is below the bottom 106 of the process chamber to isolate the supporting shaft 121 from the external environment. The lift mechanism 115 may be powered by power source 154. The lift mechanism 115 is configured to move the substrate support 120 in the vertical direction between the raised position 117 (see FIG. 1A) and the lowered position 118 (see FIG. 1B). In one implementation, the substrate support 120 is moveable in the vertical direction and rotatable around an axis 150. The substrate support 120 may be placed in the raised position 117 for processing of the substrate 50 by chemical vapor deposition (CVD) and may be placed in the lowered position 118 for processing the substrate 50 by physical vapor deposition (PVD). The pressure in the raised position 117 for CVD processing may be less than 15 Torr, preferably 2-10 Torr. The pressure in the lowered position 118 for PVD processing may be less than 2 Torr, preferably 0.1 millitor-1 Torr.

Optionally, the supporting shaft 121 may be coupled to a sealing plate 136. The sealing plate 136 may advantageously seal the first portion 132 during gas deposition on the substrate 50. The first portion 132 may also include a purge gas system. The purge gas system may include a cleaning source 146 that supplies a purge gas to the process chamber 100 during processing or cleaning of the first portion 132 of the process chamber 100. The purge gas may be oxygen, or an inert gas, such as nitrogen or argon. The purge gas helps to prevent process gases from the gas distribution plate 124 from entering portions of the interior volume 112. Additionally, the purge gases flow may prevent free radical damage to the substrate support 120. Prevention of process gases below the sealing plate 136 avoids unnecessary cleaning and contamination. Thus, using the purge gas reduces overall clean time, increases the longevity of chamber components, and increases throughput of the process chamber 100.

The chamber 100 includes the one or more targets 138 and power source 140. In one implementation, the power source 140 may be a radio frequency (RF) power source. The one or more targets 138 may be supported by a grounded conductive adapter through a dielectric isolator (not shown). The one or more targets 138 comprises the material to be deposited on the substrate 50 surface during sputtering, when the substrate support 120 is in the lowered position 118, as seen in FIG. 1B. The one or more targets 138 may be disposed in peripheral portions of the chamber 100.

In the lowered position 118, one or more targets 138 may be sputtered onto the substrate 50 within a second processing volume 148. The second processing volume 148 is disposed below the first processing volume 122 between the substrate support 120 and the one or more targets 138. In one implementation, a first target 138a may comprise one metal while a second target 138b may comprise a different metal such that deposition on the substrate provides an alloy of the metals. In another implementation, the first target 138a and the second target 138b may comprise the same material. By having multiple targets with the same material, the deposition rate is improved. The one or more targets 138 may include copper for depositing a seed layer in high aspect ratio features formed in the substrate 50. The one or more targets 138 may be annular to further improve the deposition rate and eliminate the need for a rotating pedestal.

In one implementation, a magnetron 156 is positioned above the target 138. The magnetron 156 may include a plurality of magnets supported by a base plate connected to a shaft which may be axially aligned with the central axis of the target 138. The magnets produce a magnetic field within the chamber 100 near the front face of the target 138 to generate plasma, such that a significant flux of ions strike the target 138 causing sputter emissions of the target material. The magnets may be rotated about the target 138 to increase uniformity of the magnetic field across the surface of the target 138.

In one implementation, the chamber 100 includes a shield 142 grounded within the chamber body 102. The shield 142 is comprised of a material selected from aluminum, copper, and stainless steel. In one implementation, the shield is two times as long (L) as the diameter (D) or at a L/D ratio of 2:1. In another implementation, the shield is three times as long as the diameter or at a L/D ratio of 3:1. The shield 142 may advantageously prevent plasma from penetrating and sputter coating the column 134. Additionally, the shield 142 may be disposed at an acute angle from the column 134 so as to help direct the sputtered material in an angular fashion towards the substrate 50 when the substrate support is in the lowered position 118. In one implementation, the substrate support 120 rotates around an axis 150 as the one or more targets 138 sputter material onto the substrate 50 to advantageously deposit the material uniformly upon the substrate 50. In one implementation, directional sputtering may be achieved by positioning a collimator 152 between the one or more targets 138 and the substrate support 120. The collimator 152 may be mechanically and electrically coupled to the shield 142 and the third angled surface 130. In one implementation, the collimator 152 may be electrically floating within the chamber 100. In one implementation, the collimator 152 is coupled to an electrical power source. In one implementation, the collimator 152 is a honeycomb structure having hexagonal walls separating hexagonal apertures in a close-packed arrangement. In one implementation, the collimator 152 is comprised of a material selected from aluminum, copper, and stainless steel. The collimator 152 advantageously functions as a filter to trap ions and neutrals that are emitted from the one or more targets 138 at angles exceeding a selected angle, near normal to the substrate 50. The collimator 152 may include an RF coil.

In one implementation, the one or more shields 142 are disposed at an acute angle less than 90 degrees from the column 134. The one or more shields 142 and the third angled surface 130 in part define a second portion 144 of the chamber 100. The one or more targets 138 are disposed in the second portion 144 of the chamber 100. The second portion 144 is adjacent the first portion 132. In one implementation, the second portion 144 is disposed in the periphery of the chamber 100. The one or more shields 142 are disposed between the one or more targets 138 and the gas distribution plate 124. In one implementation, the one or more shields 142 partially define the peripheral portion of the chamber 100 and partially define the central portion of the chamber 100. The peripheral portion of the chamber 100 may be disposed circumferentially around the gas distribution plate 124.

FIG. 2 is a flow diagram of a method 200 for deposition in a process chamber, according to one implementation of the disclosure. During a metal oxide deposition process for the chamber 100, at operation 210 of FIG. 2, a substrate 50 is positioned on a rotatable substrate support 120. The substrate 50 may be electrically coupled to the substrate support 120 through an electric chuck (not shown). At operation 220, the substrate support 120 is raised adjacent the gas distribution plate 124. The gas distribution plate 124 is disposed in a chamber body 102. More specifically, the gas distribution plate 124 is disposed within the first portion 132 located centrally in the chamber 100. At operation 230, a precursor fluid is flowed into a first processing volume 122. The first processing volume 122 is disposed between the gas distribution plate 124 and the rotatable substrate support 120. During deposition within the first processing volume 122, the substrate support may be stationary.

The precursor fluid may be a process gas that deposits a first layer on the substrate 50. In one implementation, the process gas is flowed for 5-25 seconds. In one implementation, the first layer is an oxide. In one implementation the process gas is a halogen containing gas such as $NF_3$. In one implementation the gas distribution plate 124 is a showerhead. Once deposition is complete, the area adjacent the first processing volume 122 and the area below the substrate support may be evacuated. In one implementation, a purge gas may be supplied to the first processing volume 122. The purge gas may be oxygen, or an inert gas, such as nitrogen or argon. The purge gas helps to prevent process gases from the gas distribution plate 124 from entering portions of the interior volume 112.

At operation 240, the substrate support 120 is lowered in the vertical direction from the first processing volume 122 to a second processing volume 148. The second processing volume 148 is disposed below the first processing volume 122. The second processing volume 148 is disposed between the substrate support 120 and the one or more targets 138. At operation 250, the substrate support may be rotated around an axis 150 while the one or more targets 138 are sputtered. The one or more targets 138 are disposed circumferentially around the gas distribution plate 124. A second layer is deposited on the first layer. The second layer may be a metal or metal alloy. In one implementation, one target 138a may sputter one metal while another target 138b sputters a different metal. In one implementation, one target 138a sputters the same metal as target 138b. In one implementation, the one or more targets 138 sputter the same metal. In another implementation, the one or more targets 138 sputter different metals.

Once sputtering is completed, operations 220 to 250 may be repeated. In other words, the substrate support 120 may be raised into the first portion 132 of the chamber 100 to deposit an oxide through CVD processing and then the substrate support 120 may be lowered into the interior volume 112 to deposit a metal through PVD processing. The oxide layer and metal layer deposition may be repeated about 80 to 100 times such that 80 to 100 layers of alternating oxide and metal are deposited on the substrate 50.

The implementations disclosed herein relate to a single oxide metal deposition chamber capable of performing both CVD and PVD to reduce the cost of uniform semiconductor processing. Additionally, the single oxide metal deposition system reduces the time necessary for deposition on semiconductor substrates.

While the foregoing is directed to implementations of the present disclosure, other and further implementations of the disclosure may be devised without departing from the basic scope thereof, and the scope thereof is determined by the claims that follow.

What is claimed is:

1. A deposition chamber, comprising:
   a gas distribution plate disposed in a chamber body;
   a metal target disposed in a peripheral portion of the chamber body;
   a substrate support disposed below the gas distribution plate, wherein the substrate support is adjustable in a vertical direction between a first position and a second position below the first position;
   a first processing volume disposed between the gas distribution plate and the substrate support when the substrate support is in the first position; and
   a second processing volume disposed between the metal target and the substrate support when the substrate support is in the second position.

2. The deposition chamber of claim 1, further comprising one or more shields disposed between the gas distribution plate and the metal target.

3. The deposition chamber of claim 2, wherein the gas distribution plate is disposed in a first portion of the chamber body and wherein the first portion is defined by a column extending from the gas distribution plate.

4. The deposition chamber of claim 3, wherein the one or more shields are disposed adjacent to and at an acute angle of less than 90 degrees from the column.

5. The deposition chamber of claim 1, wherein the substrate support is in the second position targets when in the second processing volume when the substrate support is in the second position.

6. The deposition chamber of claim 5, wherein the second processing volume surrounds the first processing volume.

7. The deposition chamber of claim 1, wherein the first processing volume is configured to perform a chemical vapor deposition process and the second processing volume is configured to perform a physical vapor deposition process.

8. A deposition chamber, comprising:
   a gas distribution plate disposed in a central portion of a chamber body;
   a plurality of targets disposed in a peripheral portion of the chamber body;
   a moveable substrate support disposed below the gas distribution plate, wherein the moveable substrate support is adjustable in a vertical direction between a first position and a second position below the first position;
   a first processing volume disposed between the gas distribution plate and the movable substrate support when the movable substrate support is in the first position;
   a second processing volume disposed between the plurality of targets and the movable substrate support when the movable substrate support is in the second position; and
   one or more shields disposed between the gas distribution plate and the plurality of targets.

9. The deposition chamber of claim 8, further comprising a column extending from the gas distribution plate partially defining the central portion of the chamber body, wherein the movable substrate support is within the column when in the first position, and wherein the movable substrate support is outside of the column when in the second position.

10. The deposition chamber of claim 9, wherein the one or more shields are disposed at an acute angle less than 90 degrees from the column.

11. The deposition chamber of claim 8, wherein the one or more shields partially define the central portion of the chamber body and the peripheral portion of the chamber body.

12. The deposition chamber of claim 8, a wherein the movable substrate support is in fluid communication with the gas distribution plate when in the first processing volume.

13. The deposition chamber of claim 12, wherein the movable substrate support is in a line of sight with each target of the plurality of targets when in the second processing volume.

14. The deposition chamber of claim 8, wherein the peripheral portion of the chamber body is disposed circumferentially around the gas distribution plate.

15. The deposition chamber of claim 8, wherein the movable substrate support is rotatable around an axis.

16. A method of deposition, comprising:
   a) positioning a substrate on a rotatable substrate support;
   b) raising the rotatable substrate support adjacent a gas distribution plate disposed in a chamber body;
   c) flowing a precursor fluid into a first processing volume and depositing a first layer on the substrate, wherein the first processing volume is disposed between the gas distribution plate and the rotatable substrate support;
   d) lowering the rotatable substrate support from the first processing volume to a second processing volume; and
   e) rotating the rotatable substrate support while sputtering one or more metals from one or more targets disposed circumferentially around the gas distribution plate and depositing a second layer on the first layer.

17. The method of claim 16, wherein the first layer is an oxide.

18. The method of claim 16, further comprising evacuating the first processing volume.

19. The method of claim 16, further comprising repeating operations b)-e).

20. The method of claim 16, wherein the second layer is a metal.

* * * * *